United States Patent

[11] 3,633,134

[72] Inventors Richard G. Barrows
Mount Prospect;
William G. Ahillen, Lombard, both of Ill.
[21] Appl. No. 12,799
[22] Filed Feb. 19, 1970
[45] Patented Jan. 4, 1972
[73] Assignee Motorola, Inc.
Franklin Park, Ill.

[54] CRYSTAL BAND PASS FILTER CIRCUIT
8 Claims, 1 Drawing Fig.

[52] U.S. Cl. .......... 333/72, 330/174, 325/379
[51] Int. Cl. .......... H03h 9/00
[50] Field of Search .......... 333/72, 79; 330/174; 325/379

[56] References Cited
UNITED STATES PATENTS

| | | | |
|---|---|---|---|
| 2,308,258 | 1/1943 | Armstrong et al. | 333/72 X |
| 2,373,431 | 4/1945 | Sykes | 333/72 |
| 3,217,265 | 11/1965 | Lungo | 330/174 X |
| 3,409,787 | 11/1968 | Agalides et al. | 333/72 X |

FOREIGN PATENTS

| | | | |
|---|---|---|---|
| 860,618 | 2/1961 | Great Britain | 333/72 |

*Primary Examiner*—Herman Karl Saalbach
*Assistant Examiner*—Saxfield Chatmon, Jr.
*Attorney*—Mueller & Aichele

ABSTRACT: A band pass filter circuit including at least two stages of crystal filtering preceding each of a pair of integrated amplifier circuits. All of the crystal filters have the same resonant frequencies, and an impedance coupling network is provided between each of the crystals and its associated utilization circuit to minimize the effects of reflected impedance variation. Also a de-Qing network is provided between each pair of the crystal filters to prevent undesired ringing of the crystal.

PATENTED JAN 4 1972 3,633,134
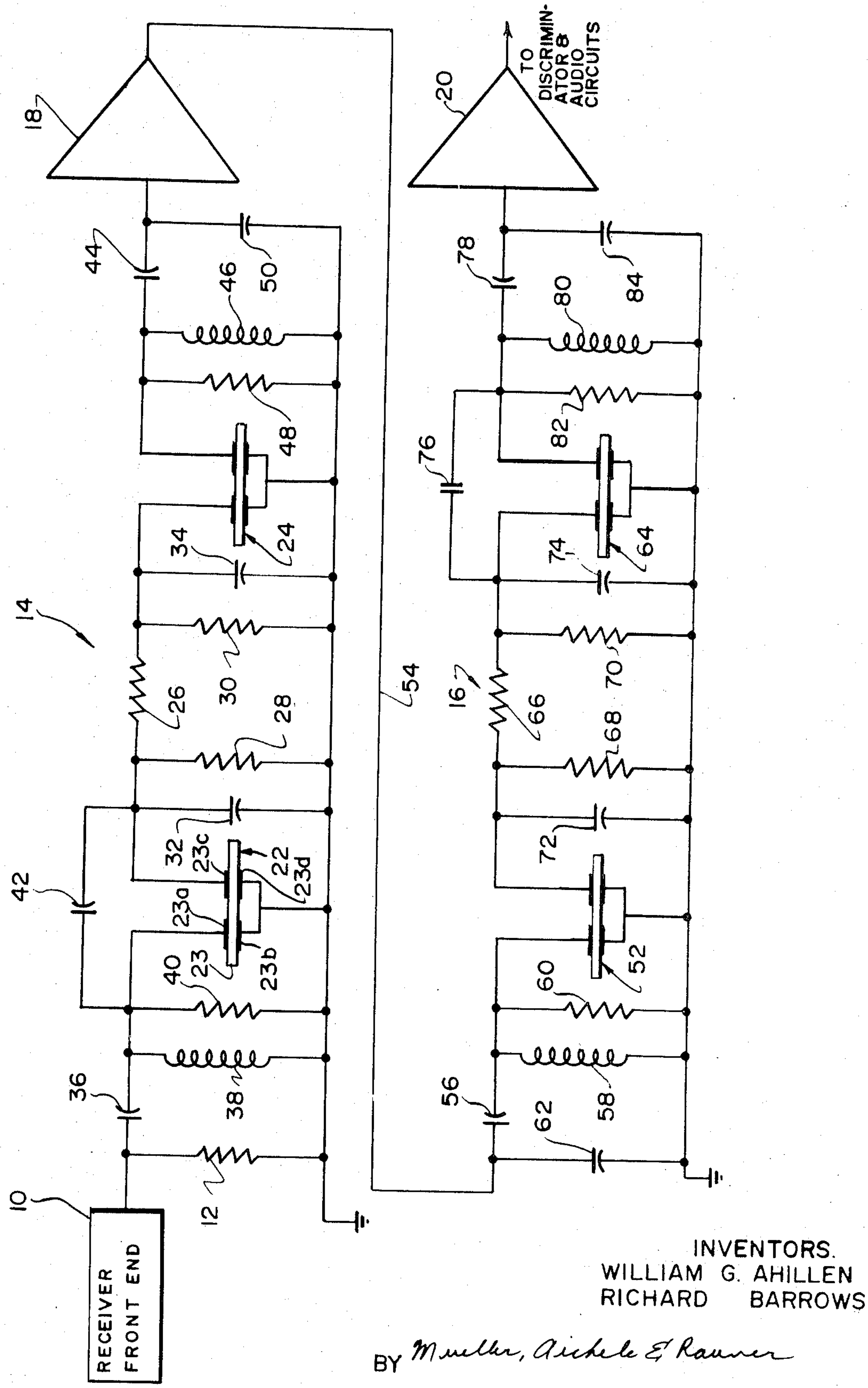
INVENTORS.
WILLIAM G. AHILLEN
RICHARD BARROWS
BY Mueller, Aichele & Rauner
ATTORNEYS.

CRYSTAL BAND PASS FILTER CIRCUIT

BACKGROUND OF THE INVENTION

This invention relates generally to filter circuits, and more particularly to band pass filter circuits used as intercoupling stages between IF amplifiers, or the like.

In providing band pass filter circuits, it is very difficult to use crystal filter elements in connection with amplifier stages which vary their input impedance over a wide range as a result of, for example, signal amplitude variation, temperature variation, or the like. That is amplifier stages which cause input or output impedance variation will accordingly produce a variation in the reflected impedance into a crystal filter. Such crystal filters will operate satisfactory with a variation of impedance of approximately 20 percent to 30 percent, but will not operate over a wide range of reflected impedances such as a 3 to 1 ratio afforded by a wide band integrated circuit (IC) amplifier.

SUMMARY OF THE INVENTION

Accordingly, one of the objects of this invention is to provide a novel filter circuit arrangement which can be used with standard IC amplifier circuits, and wherein impedance variations at the amplifier circuits are minimized at the reflected impedance of the filter circuit to within desired ranges for proper operation of the crystal filter network.

Another object of this invention is to provide a crystal filter circuit having a plurality of crystals, and wherein each crystal is center tuned to the same frequency as the other crystals.

A feature of this invention is the intercoupling between various monolithic crystal filter devices with a resistive de-Qing network to reduce or eliminate the effects of undesired ringing of the respective crystals.

Briefly, the filter circuit arrangement of this invention incorporates a pair of crystal filters as coupling devices connected in series, one with the other, between the output of an IF amplifier stage and the input of a succeeding integrated circuit (IC) which functions as an IF amplifiers stage. There may be two or more such crystal circuits coupled between respective amplifier stages, and their frequency response, i.e., their center frequency, may be any frequency desired. Preferably, the filter circuit disclosed herein has a center frequency of 11.7 MHz., which is 6 db. down at about 5.5 to 6 kHz. on either side of the center frequency and 110 db. down at 26 kHz. on either side of the center frequency. With each crystal at the same center frequency, the adverse effects of undesired ringing of the crystals are substantially reduced or eliminated by a resistive coupling network between the two crystals and which serves as a de-Qing circuit. Most advantageously, the resistive coupling network, at the particular frequency involved, includes a series resistor between the two crystals having a resistance value of approximately 820 ohms while each side of the 820 ohm resistor is coupled to ground potential through a 15 kΩ resistor which is selected to be of a particular resistance value with respect to the 820 ohm series resistor for optimum de-Qing and coupling effects. One or more of the crystal filters may be shunted by a relatively small capacitor which serves to substantially increase the slope of a band pass characteristic curve to more sharply define the desired band pass. The band pass characteristic curve is of the well known Butterworth type. Capacitive and inductive elements are selected at respective input and outputs of the crystal filter devices to provide impedance matching with the crystal devices and their respective utilization circuits which does not change substantially as a result of impedance change of the utilization circuit.

BRIEF DESCRIPTION OF THE DRAWING

The single figure illustrates a schematic diagram of a crystal filter circuit arranged in accordance with this invention. The input to the crystal filter network is here illustrated as being from the output of an FM receiver front end while the output of the crystal network is applied to a discriminator and audio circuit arrangement.

DESCRIPTION OF THE PREFERRED EMBODIMENT

The drawing illustrates diagrammatically the front end 10 of an FM receiver and preferably from the mixer stage thereof. The signals which are developed within the receiver front end 10 are impressed across a resistor 12; these signals generally being within a range of frequencies defined by a predetermined band pass. However, this initial formation of the signals to be translated through the IF portion of the particular receiver may, and generally does, include signals above and below the desired band pass frequencies. To eliminate all frequencies outside the particular band pass of the particular receiver, a pair of monolithic crystal filter circuits 14 and 16 are provided for feeding the signal information into respective wide band integrated circuit amplifiers, designated generally by reference numerals 18 and 20, respectively.

Most advantageously, the monolithic crystal filter circuits 14 and 16 include crystal selecting devices which are formed to have identical center frequencies, rather than being stagger tuned to closely adjacent frequencies. That is, a pair of crystal-selecting devices 22 and 24 within the filter network 14 have the same center frequency and are coupled together by a de-Qing network formed of a series resistor 26 and a pair of shunt resistors 28 and 30 connected to either side of the resistor 26. Preferably, each resistor 28 and 30 is shunted by a capacitor 32 and 34, respectively. The resistance value of resistor 26, together with the resistance values of resistors 28 and 30, are selected to achieve maximum signal coupling between the output of the crystal filter 22 and the input of the crystal filter 24, while allowing a substantial elimination of undesired ringing of the crystals 22 and 24 which may occur from extrinsic pulses entering the filter circuit. This is a common problem in mobile radio communication equipment where extrinsic ignition spark electromagnetic radiation may produce noise pulses in the receiver.

The input terminal of crystal-selecting device 22 is connected to the load resistor 12 via a coupling capacitor 36 which, in turn, is coupled to group potential via an inductance element 38. The values of coupling capacitor 36 and inductance 38 are selected to provide an impedance match between the output of the unijunction transistor 10 and the input of the crystal-selecting device 22. Also a resistor 40 is preferably connected in parallel with the inductance element 38.

To increase the rise and fall slope characteristic of a band pass characteristic curve obtained by the filter circuit of this invention, a capacitor 42 is connected between the input and output terminals of a crystal-selecting device 22. Capacitor 42 may, if desired, be connected across the input and output of the crystal-selecting device 24, and will function substantially in the same manner.

To match the output impedance of the crystal-selecting device 24 to the input impedance of the wide band integrated circuit amplifier 18, a coupling capacitor 44 of a particular value is connected to one end of a choke 46 which is also of a particular complimentary value with respect to capacitor 44, and a resistor 48 is connected in parallel with the inductor 46. A capacitor 50 has one end thereof connected to capacitor 44 and the other end connected to a reference potential, such as ground potential.

The novel de-Qing circuit, consisting of the resistors 26, 28 and 30, and capacitors 32 and 34 together with the improved input impedance matching circuit of capacitor 36 and inductance element 38 and the output impedance-matching circuit of capacitor 44 and the inductance element 46, forms a very sharply defined and highly selective band pass filter network which is not affected either by extrinsic noise pulses or by changes in reflected impedance. That is, the de-Qing circuit prevents undesired ringing of the crystal-selecting devices 22 and 24, and the impedance variation at the input of the amplifier 18 can be in the order of 3 to 1 or more while the reflected impedance to the crystal-selecting device 24 is substantially reduced as a result of the novel combination of elements and circuit arrangement afforded by the impedance matching circuit of capacitors 44 and 50, inductor 46 and resistor 48. For example, this network will reduce the usual 3 to 1 variation to a variation of approximately 20 percent to 30 percent, or a reduction of about 10 times.

The output of the amplifier 18 is then coupled to the input of a crystal-selecting device 52 via a line 54 and a subsequent impedance matching circuit including a capacitor 56, an inductance element 58, a resistor 60, and a second capacitor 62 having one end thereof connected to capacitor 56 and the other end thereof connected to ground potential.

Here also, a de-Qing circuit is provided for coupling the output of the crystal-selecting device 52 to the input of a crystal-selecting device 64. The de-Qing circuit includes a series resistor 66, together with a pair of parallel resistors 68 and 70, on either side of the resistor 66, and a pair of shunting capacitors 72 and 74. The de-Qing circuit between crystal-selecting devices 52 and 64 preferably is identical with the de-Qing circuit between crystal-selecting devices 22 and 24. Also, the center frequency of crystal-selecting devices 52 and 64 are the same with respect to one another and, are the same with respect to the center frequency of crystal-selecting devices 22 and 24. A capacitor 76 is connected between the input and output terminals of the crystal selecting device 64 and serves the same function as capacitor 42 with respect to the filter circuit 14.

The input impedance of the integrated circuit amplifier stage 20 is matched by providing a capacitor 78 of a particular value in combination with an inductance element 80 which, in turn, is paralleled by a resistor 82. Also, a capacitor 84 has one end thereof connected to capacitor 78 and the other end thereof connected to ground potential. The output of the integrated circuit amplifier 20 is then delivered to a suitable discriminator and audio amplifier circuits, as is well known in the art.

Preferably, the center frequency of the band pass filter circuit arrangement disclosed herein is 11.7 MHz. and is about 6 db. down at about 5.5 to 6 kHz. above and below the center frequency of 11.7 MHz. and about 110 db. down at 26 kHz. above and below the center frequency of 11.7 MHz.

The crystal-selecting devices 22, 24, 52 and 64 are of the monolithic type, preferably all being of the same center frequency and of the same structural characteristic. Therefore, only the crystal-selecting device 22 will be described in some detail, it being understood that the crystal-selecting devices 24, 52 and 64 are the same or similar. The electrical characteristics of the crystal-selecting device are such that the input and output series capacitance is about 0.0066 pf., the series resistance is about 50 ohms, and the series inductance is about 28 milihenries. The electrical characteristics also include a shunt inductance of about 25.15 microhenries. The monolithic crystal is here shown diagrammatically but some of the structural characteristics will be described. The monolithic crystal-selecting device 22 includes a crystal body 23 such as quartz, or the like. The body 23 may have a diameter in the order of 0.40 inches and a thickness of about 0.005 to 0.010 inches, more or less, depending on the particular center frequency to pass therethrough. A first pair of contact electrodes 23*a* and 23*b* are formed on diametrically opposed surface portions of the body 23 while a second pair of contact electrodes are formed on adjacent diametrically opposed surface portions. Preferably, for the particular frequency involved, the spacing between the first and second pairs of contact electrodes is about 0.025 inches, and the contact electrodes themselves are square and cover an area of about 80 square mils. The dimensions of the monolithic crystal-selecting device are selected to cause efficient electrical coupling between the two discrete sections as well as a mechanical coupling therebetween.

To obtain the particular characteristics described hereinabove, the following component values are given as typical.

| Reference No. | Value |
|---|---|
| Resistor 12 | 270 ohms |
| Resistor 26 | 820 ohms |
| Resistor 28 | 15 kΩ |
| Resistor 30 | 15 kΩ |
| Capacitor 32 | 1.5 pf. |
| Capacitor 34 | 1.5 pf. |
| Capacitor 36 | 16 pf. |
| Inductor 38 | 10 μh. |
| Resistor 40 | 27 kΩ |
| Capacitor 42 | 0.24 pf. |
| Capacitor 44 | 13 pf. |
| Inductor 46 | 15 μh. |
| Resistor 48 | 12 kΩ |
| Capacitor 50 | 18 pf. |
| Capacitor 56 | 32 pf. |
| Inductor 58 | 6 μh. |
| Resistor 60 | 15 kΩ |
| Capacitor 62 | 160 pf. |
| Resistor 66 | 820 ohms |
| Resistor 68 | 15 kΩ |
| Resistor 70 | 15 kΩ |
| Capacitor 72 | 1.5 pf. |
| Capacitor 74 | 1.5 pf. |
| Capacitor 76 | 0.39 pf. |
| Capacitor 78 | 13 pf. |
| Inductor 80 | 15 μh. |
| Resistor 82 | 8.2 kΩ |
| Capacitor 84 | 27 pf. |

Although the component values listed hereinabove are selected to be the optimum values to have a center frequency of 11.7 MHz. within the band pass, it will be understood that improved de-Qing and impedance matching can be obtained for a crystal filter circuit having any desired frequency response.

What has been described is a band pass filter circuit which has a plurality of crystal-selecting devices, each having the same frequency, and wherein the effects of reflected impedance variations is substantially eliminated over a wide range of such impedance variations. Also, the crystal filter circuit of this invention substantially eliminates extraneous ringing of the respective crystal-selecting devices as a result of undesired extraneous signals which may enter the filter network. Accordingly, it will be understood that variations and modifications of this invention may be effected without departing from the spirit and scope of the novel concepts disclosed and claimed herein.

We claim:

1. A band pass filter circuit for passing frequencies within a predetermined band pass comprising, input circuit means for receiving signals including signals which fall within the band pass of the filter circuit, first monolithic crystal-selecting means including a single crystal element having first and second pairs of electrodes thereon forming first and second coupled resonators, second monolithic crystal-selecting means including a single crystal element having third and fourth pairs of electrodes thereon forming third and forth coupled resonators, each resonator of said first and second monolithic crystal-selecting means having the same resonant frequency, said input circuit means being coupled to said first pair of electrodes to apply signals to said first resonator, output circuit means coupled to said fourth pair of electrodes to receive from said fourth resonator signals of frequencies within the band pass of the filter circuit, and de-Qing circuit means coupled to said second and third pairs of electrodes for applying signals from said second resonator to said third resonator and including a first resistor connected between electrodes of said second and third pairs, a resistor connected across said electrodes of said second pair, a third resistor connected across said electrodes of said third pair, a first capacitor bridging said second resistor, and a second capacitor bridging said third resistor, said de-Qing circuit means reducing ringing effects through said resonators.

2. The band pass filter circuit of claim 1 wherein said first resistor has a value of 820 ohms and said second and third resistors each have a value of 15 kΩ and said first and second capacitors have a value of 1.5 pf.

3. The band pass filter circuit of claim 1 including a 0.24 pf. capacitor connected between said first and second pairs of electrodes to form a shunt coupling between said first and second coupled resonators.

4. The band pass filter circuit of claim 1 including a 0.39 pf. capacitor connected between said third and fourth pairs of electrodes to form a shunt coupling between said third and fourth coupled resonators.

5. A band pass filter circuit of claim 1 further including a first inductance element having one end thereof connected to said input circuit means and the other end thereof connected to a reference potential, a second inductance element having one end thereof connected to the output circuit means and the other end thereof connected to said reference potential, resistance means coupled in parallel with each of said first and second inductance elements, a first capacitive element connected between said input circuit means and said first pair of electrodes, and having a capacitance value with respect to said first inductance element and said associated resistance means to form a first impedance matching network, and a second capacitive element connected between said output circuit means and said fourth pair of electrodes and having a capacitance value with respect to said second inductance element and said associated resistance means to form a second impedance-matching network, whereby changes in impedance coupled to said input circuit means or said output circuit means are minimized by said first and second impedance-matching networks, respectively to prevent loading of said first and second monolithic crystal-selecting means.

6. A band-pass filter circuit for passing frequencies within a predetermined band pass comprising, input circuit means for receiving signals including signals which fall within the band-pass of the filter circuit, first monolithic crystal-selecting means including a single crystal element having first and second pairs of electrodes thereon forming first and second coupled resonators, second monolithic crystal-selecting means including a single crystal element having third and fourth pairs of electrodes thereon forming third and fourth coupled resonators, each resonator of said first and second monolithic crystal-selecting means having the same resonant frequency, said input circuit means being coupled to said first pair of electrodes to apply signals to said first resonator, amplifying circuit means having an input coupled to said fourth pair of electrodes to receive from said fourth resonator signals of frequencies within the band pass of the filter circuit, first de-Qing circuit means coupled to said second and third pairs of electrodes for applying signals from said second resonator to said third resonator and including a first resistor connected between electrodes of said second and third pairs, a second resistor connected across said electrodes of said second pair, a third resistor connected across said electrodes of said third pair, a first capacitor bridging said second resistor, and a second capacitor bridging said third resistor, said de-Qing circuit means reducing ringing effects through said first, second, third and fourth resonators, third monolithic crystal-selecting means including a single crystal element having fifth and sixth pairs of electrodes thereon forming fifth and sixth coupled resonators, fourth monolithic crystal-selecting means including a single crystal element having seventh and eighth pairs of electrodes thereon forming seventh and eighth coupled resonators, each resonator of said third and fourth monolithic crystal-selecting means having the same resonant frequency, said amplifying circuit means having an output coupled to said fifth pair of electrodes to apply signals to said third resonator, output circuit means coupled to said eighth pair of electrodes to receive from said eighth resonator signals of frequencies within the band pass of the filter circuit, and second de-Qing circuit means coupled to said sixth and seventh pairs of electrodes for applying signals from said sixth resonator to said seventh resonator and including a fourth resistor connected between electrodes of said sixth and seventh pairs, a fifth resistor connected across said electrodes of said sixth pair, a sixth resistor connected across said electrodes of said seventh pair, a third capacitor bridging said fifth resistor, and a fourth capacitor bridging said sixth resistor, said second de-Qing circuit means reducing ringing effects through said fifth, sixth, seventh and eighth resonators.

7. The band pass filter circuit of claim 6 including a first shunting capacitor connected between said first and second coupled resonators and a second shunting capacitor connected between said seventh and eighth coupled resonators for shaping the band pass characteristic curve.

8. The band pass filter circuit of claim 7 wherein said first shunting capacitor is a 0.24 pf. capacitor and said second shunting capacitor is a 0.39 pf. capacitor.

* * * * *